US008525188B2

(12) United States Patent
Zhong et al.

(10) Patent No.: US 8,525,188 B2
(45) Date of Patent: Sep. 3, 2013

(54) SHALLOW TRENCH ISOLATION STRUCTURE AND METHOD FOR FORMING THE SAME

(75) Inventors: Huicai Zhong, Beijing (CN); Qingqing Liang, Beijing (CN); Haizhou Yin, New York, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 51 days.

(21) Appl. No.: 13/132,068

(22) PCT Filed: Jan. 27, 2011

(86) PCT No.: PCT/CN2011/070687
§ 371 (c)(1),
(2), (4) Date: May 31, 2011

(87) PCT Pub. No.: WO2012/065369
PCT Pub. Date: May 24, 2012

(65) Prior Publication Data
US 2012/0126245 A1    May 24, 2012

(30) Foreign Application Priority Data
Nov. 19, 2010   (CN) .......................... 2010 1 0552318

(51) Int. Cl.
*H01L 31/0312* (2006.01)
*H01L 29/00* (2006.01)
*H01L 29/76* (2006.01)
*H01L 29/94* (2006.01)
*H01L 31/062* (2012.01)

(52) U.S. Cl.
USPC ............. 257/77; 257/510; 257/506; 257/374

(58) Field of Classification Search
USPC .................. 257/77, 524, 523, 510, 506, 374, 257/647, 396
See application file for complete search history.

(56) References Cited

U.S. PATENT DOCUMENTS
6,313,008 B1    11/2001  Leung
2007/0059897 A1  3/2007  Tilke
2009/0152670 A1*  6/2009  Kim ............................ 257/506

FOREIGN PATENT DOCUMENTS
CN    1612315      5/2005
CN    101253617    8/2008
JP    2005116983   4/2005

OTHER PUBLICATIONS

PCT International Search Report dated Sep. 1, 2011, PCT Application No. PCT/CN2011/070687.
Written Opinion of the International Searching Authority dated Sep. 1, 2011, PCT Application No. PCT/CN2011/070687.
English Translation of Abstract of Japanese Patent JP2005116983.
English Translation of Abstract of Chinese Patent CN1612315.
English Translation of Abstract of Chinese Patent CN101253617.

* cited by examiner

*Primary Examiner* — Chuong A. Luu
(74) *Attorney, Agent, or Firm* — Vierra Magen Marcus LLP

(57) ABSTRACT

The invention provides a STI structure and method for forming the same. The STI structure includes a semiconductor substrate; a first trench embedded in the semiconductor substrate and filled up with a first dielectric layer; and a second trench formed on a top surface of the semiconductor substrate and interconnected with the first trench, wherein the second trench is filled up with a second dielectric layer, a top surface of the second dielectric layer is flushed with that of the semiconductor substrate, and the second trench has a width smaller than that of the first trench. The invention reduces dimension of divots and improves performance of the semiconductor device.

4 Claims, 6 Drawing Sheets

US 8,525,188 B2

SHALLOW TRENCH ISOLATION STRUCTURE AND METHOD FOR FORMING THE SAME

This application is a Section 371 National Stage Application of International Application No. PCT/CN2011/070687, filed on Jan. 27, 2011, which claims the benefit of CN 201010552318.2, filed on Nov. 19, 2010, the entire contents of which are incorporated herein by reference in their entirety.

BACKGROUND OF THE INVENTION

1. Field of the Invention

The present invention relates to semiconductor manufacturing technology, and particularly, relates to a Shallow Trench Isolation (STI) structure and a method for manufacturing the same.

2. Background of the Invention

As the semiconductor technology advances into deep submicron era, active regions of semiconductor devices, such as Metal-Oxide-Semiconductor field-effect transistor (MOSFET), are generally isolated by STI structures. The method for fabricating the shallow trench isolation structure comprises: forming a shallow trench on a substrate by an etching process for isolating active regions within the substrate; filling up the shallow trench with a dielectric material to further cover the surface of the substrate; and planarizing the dielectric material to expose the surface of the substrate, wherein the planarization may be Chemical Mechanical Polishing (CMP) method. After formation of the STI, semiconductor devices, such as MOSFETs, are fabricated on the active regions between the STIs.

FIG. 1 shows STI structures formed by prior art, comprising: a semiconductor substrate 10; and STIs formed within the substrate, wherein the STIs are filled with dielectric materials 11, an active area is formed between the STIs within the substrate, and a semiconductor device (such as a MOSFET comprising a gate structure, a source region and a drain region) is formed in the active region. However, in the prior art STIs, because of the planarization process and the cleaning process thereafter, downward depressions are formed between the surface of the dielectric material 11 and the surface of the adjacent substrate 10, which depressions are referred to divots 12. The divots 12 may lead to high leakage current and performance degradation of the semiconductor device. Moreover, with the scaling of the dimension of semiconductor devices, the dimension of the divots relative to the semiconductor device formed between the STIs becomes bigger, influences on performance of the semiconductor device become increasingly serious.

SUMMARY OF THE INVENTION

An object of the present invention is to provide a STI structure and a manufacturing method thereof for reducing dimension of divots and improving performance of the semiconductor device.

To achieve the object, the present invention provides a STI structure, comprising:
 a semiconductor substrate;
 a first trench embedded in the semiconductor substrate and filled up with a first dielectric layer; and
 a second trench formed on a top surface of the semiconductor substrate and interconnected with the first trench, wherein the second trench is filled up with a second dielectric layer, a top surface of the second dielectric layer is flushed with that of the semiconductor substrate, and the second trench has a width smaller than that of the first trench.

Optionally, the semiconductor substrate is a silicon substrate, a silicon germanium substrate, a III-V group compound substrate, a silicon carbide substrate or a stacked structure thereof, or a silicon on insulator substrate, or a diamond substrate.

Optionally, the semiconductor substrate comprises a first semiconductor substrate and an epitaxial layer thereon. The first trench is formed in the first semiconductor substrate, and the second trench is formed in the epitaxial layer.

Optionally, the epitaxial layer has a thickness less than 100 nm.

To achieve the object, the present invention further provides a method for manufacturing a STI structure, comprising:
 providing a first semiconductor substrate having opposite first and second surfaces, wherein the first trench is formed in the first surface, and a first dielectric layer is filled up into the first trench;
 forming a second trench on the second surface of the first semiconductor substrate, wherein the first dielectric layer is exposed at bottom of the second trench, and the second trench has a width smaller than that of the first trench; and
 filling a second dielectric layer into the second trench, wherein a top surface of the second trench is flushed with the second surface.

Optionally, the first dielectric layer further covers the first surface, and the method for manufacturing a STI structure further comprises: providing a second semiconductor substrate having a third dielectric layer formed thereon; and bonding the first dielectric layer with the third dielectric layer.

Optionally, the first semiconductor substrate is a silicon substrate, a silicon germanium substrate, a III-V group compound substrate, a silicon carbide substrate or a stacked structure thereof, or a silicon on insulator substrate, or a diamond substrate.

Optionally, the second dielectric layer has a thickness less than 100 nm.

To achieve the object, the present invention further provides a method for manufacturing a STI structure, comprising:
 providing a semiconductor substrate having a first trench formed thereon, wherein the first trench is filled up with a first dielectric layer;
 forming an epitaxial layer on the semiconductor substrate to cover the semiconductor substrate and the first dielectric layer;
 forming a second trench in the epitaxial layer having a width smaller than that of the first trench, wherein the first dielectric layer is exposed at bottom of the second trench; and
 filling a second dielectric layer into the second trench, wherein a top surface of the second dielectric layer is flushed with that of the epitaxial layer.

Optionally, the semiconductor substrate is a silicon substrate, a silicon germanium substrate, a III-V group compound substrate, a silicon carbide substrate or a stacked structure thereof, or a silicon on insulator substrate, or a diamond substrate.

Optionally, the epitaxial layer is made of silicon, silicon carbide, silicon germanium, a III-V group compound, or any combination thereof.

Optionally, the epitaxial layer has a thickness less than 100 nm.

Compared with the prior art, the present invention has the following advantages.

The STI structure of the present invention comprises a first trench and a second trench. The first trench is embedded in a semiconductor substrate, and the second trench is formed on a top surface of the semiconductor substrate and is interconnected with the first trench. The width of the second trench is smaller than that of the first trench. Because the width of the second trench formed on the top surface of the semiconductor substrate is smaller, dimension of divots formed between the semiconductor substrate and a second dielectric layer deposited in the second trench is smaller, thereby improving performance of the semiconductor device.

Furthermore, because the width of the second trench formed on the top surface of the semiconductor substrate is smaller, an area occupied by the second trench on the top surface of the semiconductor substrate is smaller, thereby increasing active areas between the second trench which are used for fabricating semiconductor devices, reducing contact resistance between the semiconductor devices and the upper interconnection structure thereof, and improving performance of the semiconductor device.

DETAILED DESCRIPTION OF THE EMBODIMENTS

According to a STI structure manufactured in the prior art, divots are formed between a surface of the dielectric material filled in the STI structure and a surface of the substrate, which leads to leakage current and degradation of semiconductor device performance.

A STI structure formed according to the present invention comprises a first trench and a second trench. The first trench is embedded in a semiconductor substrate, and the second trench is formed on a top surface of the semiconductor substrate and is interconnected with the first trench. The width of the second trench is smaller than that of the first trench. Because the width of the second trench formed on the top surface of the semiconductor substrate is smaller, dimension of divots formed between the semiconductor substrate and a second dielectric layer deposited in the second trench is smaller, thereby improving performance of the semiconductor device.

Furthermore, because the width of the second trench formed on the top surface of the semiconductor substrate is smaller, an area occupied by the second trench on the top surface of the semiconductor substrate is smaller, thereby increasing active areas between the second trench which is used for fabricating semiconductor devices, reducing contact resistance between the semiconductor devices and the upper interconnection structure thereof, and improving performance of the semiconductor device.

Hereafter, the present invention will be described in detail with reference to embodiments in conjunction with the accompanying drawings.

Although the present invention has been disclosed hereinafter as above with reference to preferred embodiments in detail, it can be implemented in other different embodiments. Therefore, the present invention should not be limited to the embodiments disclosed herein.

Figure 1:
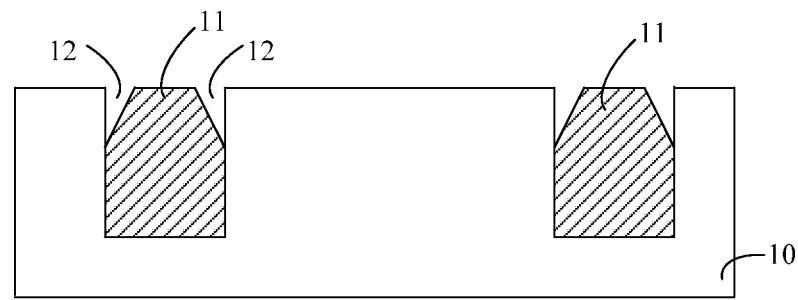
FIG. 1 shows a cross-sectional view of STIs formed in the prior art.
Figure 2:
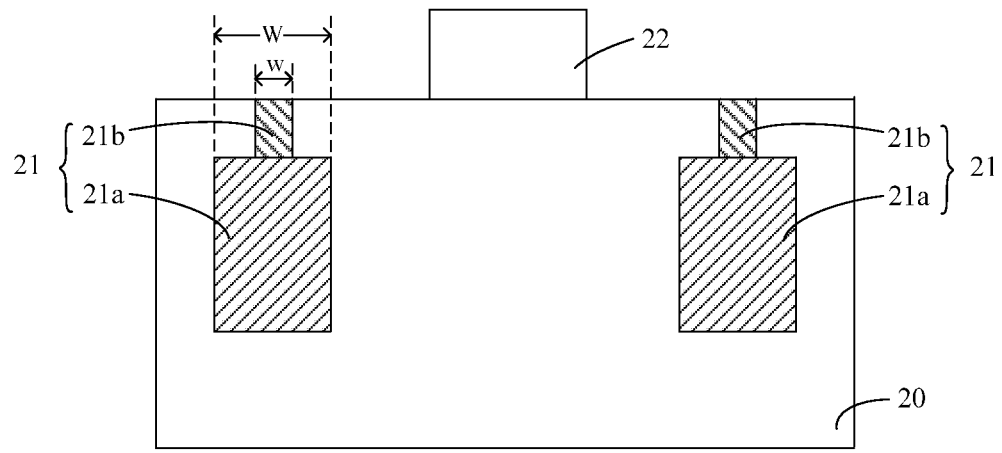
FIG. 2 shows a cross-sectional view of STI structures in an embodiment of the present invention.

FIG. 2 shows a cross-sectional view of a STI structure in the first embodiment of the present invention. Referring to FIG. 2, the STI structure comprises: a semiconductor substrate 20; a first trench 21a embedded in the semiconductor substrate 20 and filled up with a first dielectric layer; a second trench 21b formed within a top surface of the semiconductor substrate 20 and interconnected with the first trench 21a, the second trench 21b being filled up with a second dielectric layer, the second dielectric layer being flushed with the semiconductor substrate 20, and the second trench 21b having a width smaller than that of the first trench 21a. The first trench 21a and the second trench 21b together constitute the isolation trench 21 of the present embodiment. Semiconductor devices, for example, a MOSFET comprising a gate structure 22, and source and drain regions (not shown in the figure), or a bipolar transistor, may be formed on the semiconductor substrate 20 between the second trench 21b.

The semiconductor substrate 20 is a silicon substrate, a silicon germanium substrate, a III-V group compound substrate (such as gallium arsenide, indium phosphide, gallium nitride, etc.), a silicon carbide substrate or a stacked structure thereof, or a silicon on insulator substrate, or a diamond substrate, or any other semiconductor substrates known to a person skilled in the art. If the semiconductor substrate 20 is of a silicon on insulator structure, the first trench 21a and the second trench 21b are formed in the silicon material on the insulator layer, the insulator layer is below the first trench 21a, and the silicon material is provided below the insulator layer.

Sidewalls of the first trench 21a may be perpendicular or tilting with respect to the bottom of the first trench 21a.

The materials of the first dielectric layer and the second dielectric layer may be silicon oxide, silicon nitride or a combination thereof, or any other dielectric materials known to the person skilled in the art. The material of the first dielectric layer may be the same or different from that of the second dielectric layer. In an embodiment, a liner layer is formed on bottom and sidewalls of the first trench 21a under the first dielectric layer, and the liner layer may be made of silicon oxide.

In an embodiment, the semiconductor substrate 20 comprises a first semiconductor substrate and an epitaxial layer thereon. In order to illustrate the embodiment briefly and clearly, the first semiconductor substrate and the epitaxial layer are not shown in FIG. 2. The first trench 21a is formed in the first semiconductor substrate, and the second trench 21b is formed in the epitaxial layer. The first semiconductor substrate may be a silicon substrate, a silicon germanium substrate, a III-V group compound substrate (such as gallium arsenide, indium phosphide, gallium nitride, etc.), a silicon carbide substrate or a stacked structure thereof, or a silicon on insulator substrate, or a diamond substrate. The epitaxial layer may be made of silicon, silicon carbide, silicon germanium, or a III-V group compound, or any combination thereof formed on the surface of the first semiconductor substrate by processes such as epitaxial growth, or other semiconductor materials known to a person skilled in the art. In a specific embodiment, the epitaxial layer may have a thickness less than 100 nm.

Because the second trench 21b has a width smaller than that of the first trench 21a, dimension of the divots formed between the surface of the second dielectric layer in the second trench and the surface of the semiconductor substrate 20 is smaller, which may advantageously lead to reduction of leakage current caused by divots and improvement of semiconductor device performance.

Furthermore, area of the active region is always within a fixed range at certain processing level in practice of manufacturing, and STIs are used for isolating active regions. According to the present embodiment, because the width of the second trench 21b formed in the semiconductor substrate 20 is smaller, the second trench occupies a smaller surface area, and areas used for fabricating semiconductor devices are increased. For example, as for a MOSFET, the source region and the drain region have greater surface area than that in prior art, thereby increasing the contact area of a via connected to the source/drain regions, reducing the contact resistance, and improving performance of the semiconductor device.

Figure 3:
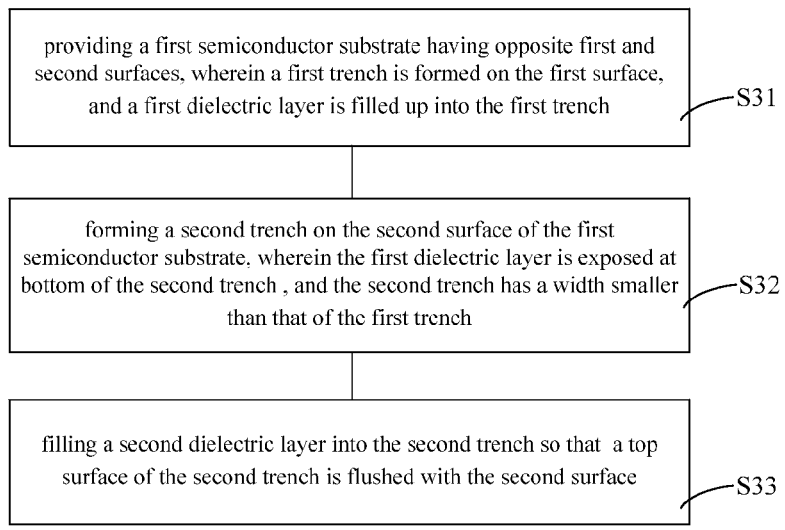
FIG. 3 is a flow chart of a method for manufacturing STI structures in a first embodiment.

FIG. 3 is a flow chart of a method for manufacturing a STI in the first embodiment. The method shown in FIG. 3 comprises:

Step S31: providing a first semiconductor substrate having opposite first and second surfaces, wherein the first trench is formed in the first surface, and a first dielectric layer is filled up into the first trench;

Step S32: forming a second trench on the second surface of the first semiconductor substrate, wherein the first dielectric layer is exposed at bottom of the second trenches, and the second trench has a width smaller than that of the first trench;

Step S33: filling a second dielectric layer into the second trench, wherein a top surface of the second trench is flushed with the second surface.

FIG. 4 to FIG. 8 are cross-sectional views of intermediate structures in a method for manufacturing the STI structures according to the first embodiment of the present invention. Hereafter, the first embodiment is illustrated in detail referring to FIGS. 3 to 8.

Figure 4:
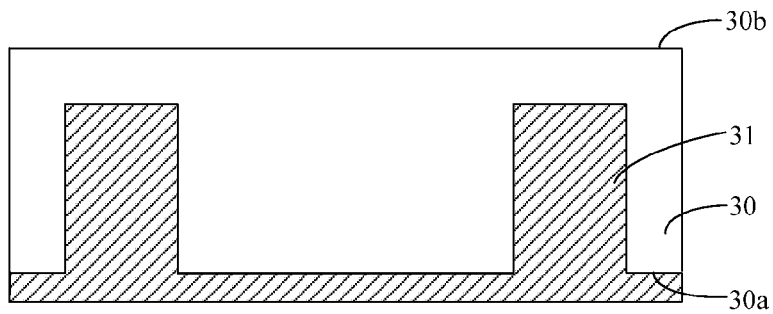
FIG. 4 to FIG. 8 are cross-sectional views of intermediate structures in a method for manufacturing the STI structures according to the first embodiment of the present invention.

Referring to FIGS. 3 and 4, step S31 is performed. A first semiconductor substrate having opposite first and second surfaces is provided. The first trench is formed on the first surface and filled up with the first dielectric layer. Specifically, a first semiconductor substrate 30 is provided. The first semiconductor substrate 30 comprises opposite first and second surfaces 30a, 30b. The first trench 31 is formed on the first surface 30a and filled up with the first dielectric layer. In the embodiment, the first dielectric layer may also cover the first surface 30a.

The first semiconductor substrate 30 may be a silicon substrate, a silicon germanium substrate, a III-V group compound substrate, a silicon carbide substrate or a stacked structure thereof, or a diamond substrate. The method for fabricating the first trench 31 may comprise: forming an etching liner layer and a hard mask layer sequentially on the first surface 30a of the first semiconductor substrate 30, wherein the etching liner layer may be made of silicon oxide, and the hard mask layer may be made of silicon nitride; forming a photoresist layer on the hard mask layer and patterning the photoresist layer to define the pattern of the first trench 31; etching the hard mask layer and the etching liner layer by using the patterned photoresist layer as a mask; removing the photoresist layer and etching the first surface 30a of the first semiconductor substrate 30 by using the hard mask layer as a mask to form the first trench 31, wherein sidewalls of the first trench 31 may be perpendicular or tilting with respect to the bottom of the first trench 31. The first dielectric layer may be made of silicon oxide, silicon nitride or a combination thereof, and may be formed by Chemical Vapor Deposition (CVD) method. A liner layer may be formed to cover bottom and sidewalls of the first trench before formation of the first dielectric layer. The first dielectric layer may be formed on the liner layer, and the liner layer may be made of silicon oxide.

Figure 5:
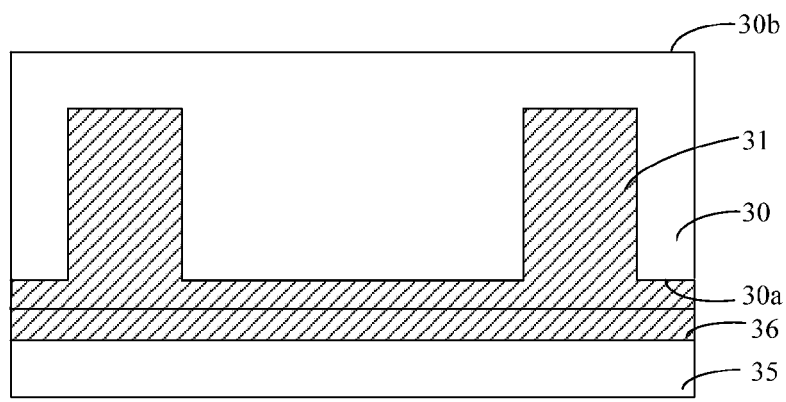

Referring to FIG. 5, a second semiconductor substrate 35 is provided. A third dielectric layer 36 is formed on top of the second semiconductor substrate 35. The third dielectric layer 36 is bonded with the first dielectric layer so that the first semiconductor substrate 30 and the second semiconductor substrate 35 are jointed together.

The second semiconductor substrate 35 may be a silicon substrate, a silicon germanium substrate, a III-V group compound substrate, a silicon carbide substrate or a stacked structure thereof, or a diamond substrate. The second semiconductor substrate 35 may be made of the same or different material from that of the first semiconductor substrate 30. In order to facilitate bonding, the material of the third dielectric layer 36 is the same as that of the first dielectric layer.

Figure 6:
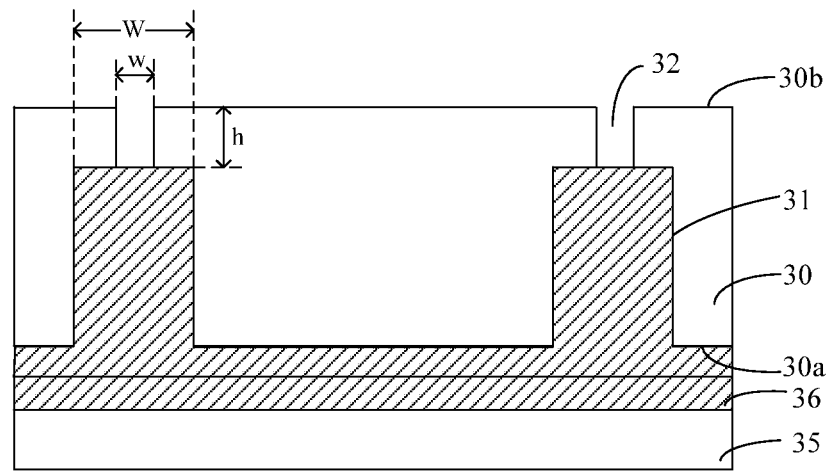

Referring to FIGS. 3 and 6, the step S32 is performed. The second trench is formed on the second surface of the first semiconductor substrate. The first dielectric layer is exposed at bottom of the second trench, and the second trench has a width smaller than that of the first trench. Specifically, the second trench 32 is formed on the second surface 30b of the first semiconductor substrate 30, the first dielectric layer in the first trench 31 is exposed at bottom of the second trench 32, and the width w of the second trench 32 is smaller than the width W of the first trench 31.

The method for forming the second trench 32 comprises: forming a photoresist layer on the second surface 30b of the first semiconductor substrate 30 and patterning the photoresist layer to define the pattern of the second trench 32; etching to form the second trench 32 by using the patterned photoresist layer as a mask; and removing the photoresist layer. In the embodiment, the depth h of the second trench 32 is less than 100 nm. In other words, after forming the first trench 31, the distance between the bottom of the first trench 31 and the second surface 30b is less than 100 nm. Because the depth h of the second trench 32 is smaller, profile of the second trench 32 may be easily controlled during the etching process.

Figure 7:
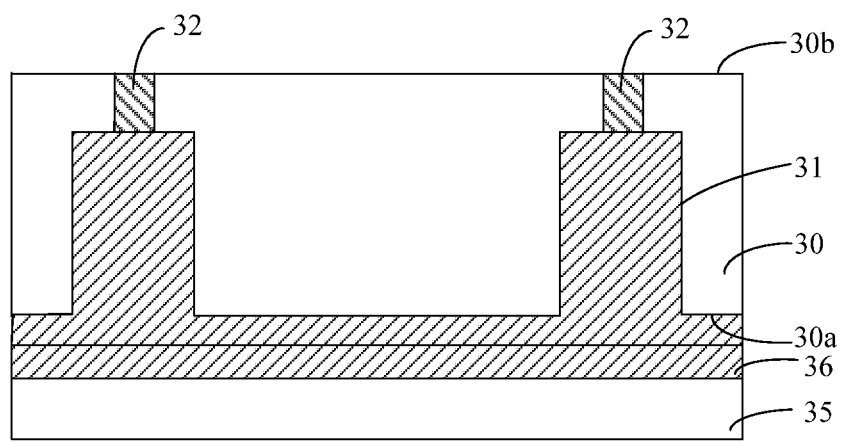

Referring to FIGS. 3 and 7, the step S33 is performed. The second dielectric layer is filled into the second trench such that the top surface of the second dielectric layer is flushed with the second surface. Specifically, the second dielectric layer is filled into the second trench 32 and is planarized so that the top surface of the second dielectric layer is flushed with the second surface 30b. The second dielectric layer may be made of silicon oxide, silicon nitride or a combination thereof, and may be formed by Chemical Vapor Deposition (CVD) method. In a specific embodiment, the second dielectric layer may be made of the same or different material from that of the first dielectric layer. The planarization may be performed by CMP method.

Up to now, the STI structure of the first embodiment is formed. The STI structure comprises: the first semiconductor substrate 30; the first trench 31 formed on the first surface 30a of the first semiconductor substrate 30 and filled with the first dielectric layer; the second trench 32 formed on the second surface 30b of the first semiconductor substrate 30, interconnected with the first trench 31, and filled with the second dielectric layer. In addition, the STI structure further comprises the second semiconductor substrate 35 and the third dielectric layer 36 formed on the second semiconductor substrate 35. The third dielectric layer 36 is boned with the first dielectric layer. The third dielectric layer 36 and the first dielectric layer which covers the first surface 30a constitute a silicon on insulator structure, and the first trench and the second trench are formed in the silicon material of the silicon on insulator structure.

Figure 8:
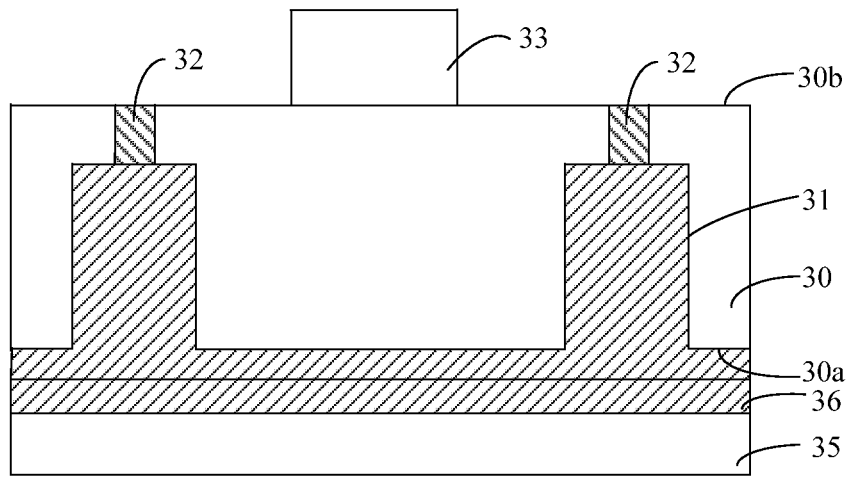

Referring to FIG. 8, a semiconductor device is formed on the second surface 30b of the first semiconductor substrate 30 between the second trench 32. The semiconductor device may be a MOSFET comprising a gate structure 33, a source and a drain, or a bipolar transistor or other semiconductor devices in other embodiments.

Referring to FIG. 7, in the embodiment, because the width w of the second trench 32 is smaller than that of the first trench 31, dimension of the divots formed between the second dielectric layer in the second trench and the first semiconductor substrate 30 is smaller, thereby improving performance of the semiconductor device. In addition, the surface area of the second trench 32 is smaller, so that the surface area between the second trench 32 which is used for forming semiconductor device is increased, thereby increasing the contact area between the semiconductor device and the subsequent interconnect structure, reducing the contact resistance, and improving performance of the semiconductor device.

Figure 9:
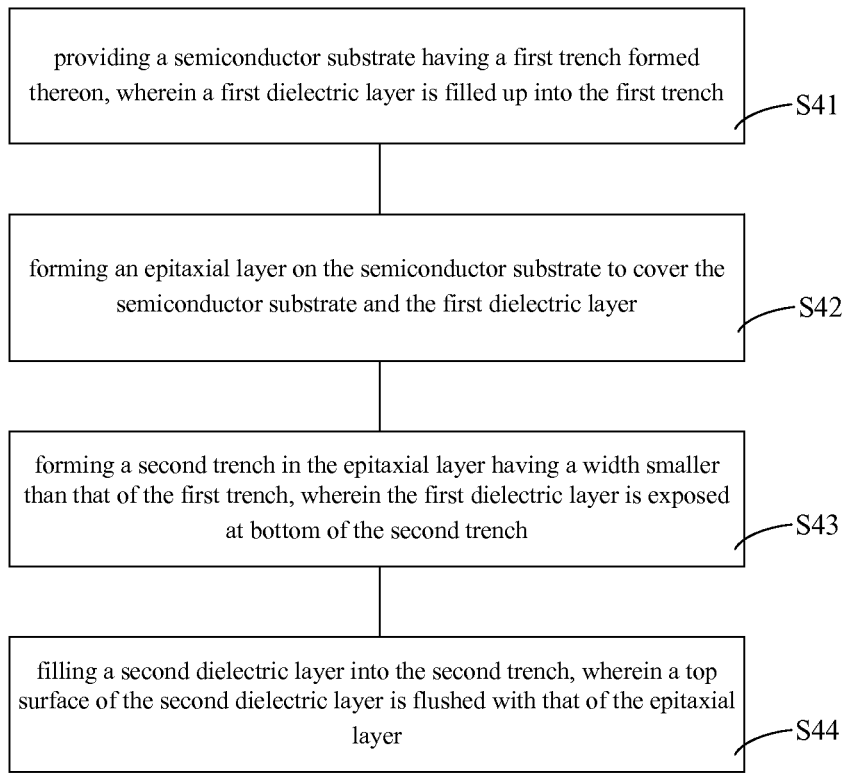
FIG. 9 is a flow chart of a method for manufacturing STI structures in a second embodiment.

FIG. 9 is a flow chart of a method for manufacturing a STI structure in the second embodiment comprising:

Step S41: providing a semiconductor substrate having a first trench formed thereon, wherein the first trench is filled up with a first dielectric layer;

Step S42: forming an epitaxial layer on the semiconductor substrate to cover the semiconductor substrate and the first dielectric layer;

Step S43: forming a second trench in the epitaxial layer having a width smaller than that of the first trench, wherein the first dielectric layer is exposed at bottom of the second trench;

Step S44: filling a second dielectric layer into the second trench, wherein a top surface of the second dielectric layer is flushed with that of the epitaxial layer.

FIG. 10 to FIG. 14 are cross-sectional views of intermediate structures in a method for manufacturing the STI structures according to the second embodiment of the present invention. Hereafter, the second embodiment will be illustrated in detail, in conjunction with FIGS. 9 to 14.

Figure 10:
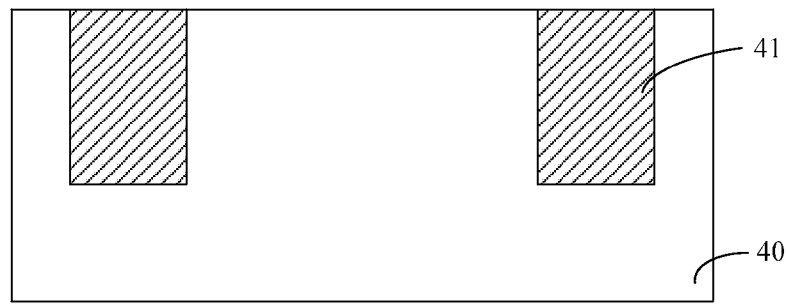
FIG. 10 to FIG. 14 are cross-sectional views of intermediate structures in a method for manufacturing the STI structures according to the second embodiment of the present invention.

Referring to FIGS. 9 and 10, the step S41 is performed. A semiconductor substrate is provided, a first trench is formed on a top surface of the semiconductor substrate, and a first dielectric layer is formed in the first trench. Specifically, a semiconductor substrate 40 is provided, the first trench 41 is formed on the top surface of the semiconductor substrate 40, and a first dielectric layer is formed in the first trench 41. The method for fabricating the first trench 41 comprises: forming an etching liner layer and a hard mask layer successively on a surface of the semiconductor substrate 40, the etching liner layer being made of silicon oxide, and the hard mask layer being made of silicon nitride; forming a photoresist layer on the hard mask layer and patterning the photoresist layer to define the pattern of the first trench 41; etching the hard mask layer and the etching liner layer by using the patterned photoresist layer as a mask; removing the photoresist layer and etching the semiconductor substrate 40 by using the hard mask layer as a mask to form the first trench 41, sidewalls of the first trench 41 being perpendicular to or forming an obtuse angle relative to bottom of the first trench 41. The first dielectric layer is made of silicon oxide, silicon nitride or compounds thereof and is formed by chemical vapor deposition. Before forming the first dielectric layer, a liner layer may be formed covering the bottoms and sidewalls of the first trench 41. The first dielectric layer is formed on the liner layer. The liner layer is made of silicon oxide.

Figure 11:
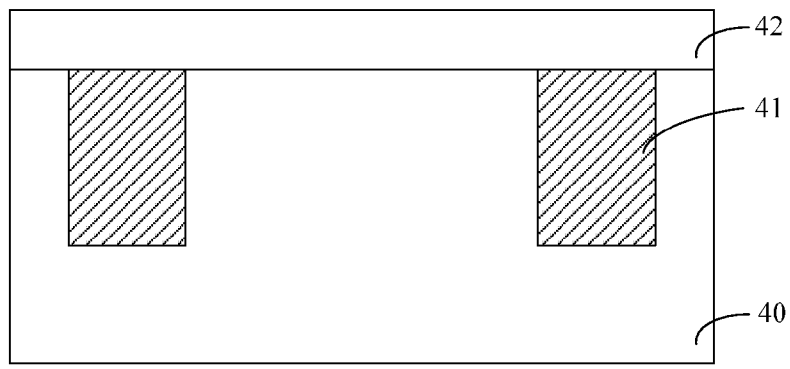

Referring to FIGS. 9 and 11, the step S42 is performed. An epitaxial layer is formed on the semiconductor substrate, and the epitaxial layer covers the semiconductor substrate and the first dielectric layer. Specifically, an epitaxial layer 42 is formed on the semiconductor substrate 40, and the epitaxial layer 42 covers the semiconductor substrate 40 and the first dielectric layer. The method for fabricating the epitaxial layer 42 is epitaxial growth, and the material of the epitaxial layer 42 is silicon, silicon carbide, silicon germanium, a III-V group compound or combination thereof. Optionally, the thickness of the epitaxial layer is less than 100 nm.

Figure 12:
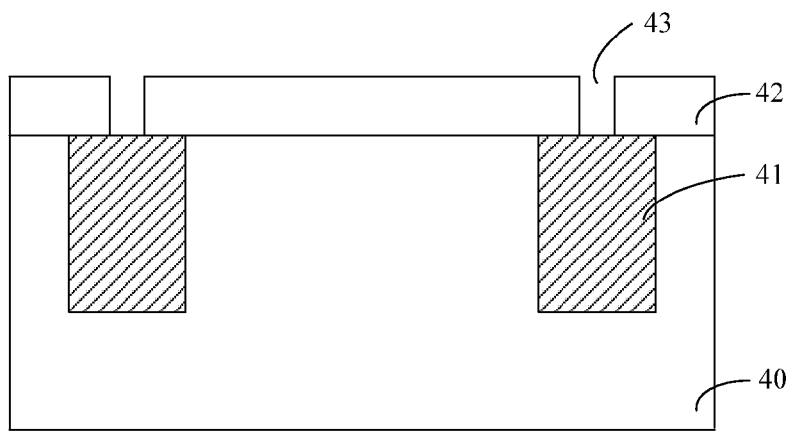

Referring to FIGS. 9 and 12, the step S43 is performed. The second trench is formed in the epitaxial layer, the width of the second trench is smaller than that of the first trench, and the first dielectric layer is exposed at bottom of the second trench. Specifically, the second trench 43 are formed in the epitaxial layer 42, the width of the second trench 43 is smaller than that of the first trench 41, and the first dielectric layer in the first trench 41 is exposed at bottom of the second trench 43. The method for forming the second trench 43 comprises: forming a photoresist layer on the epitaxial layer 42 and patterning the photoresist layer to define the pattern of the second trench 43; etching the epitaxial layer 42 to form the second trench 43 by using the patterned photoresist layer as a mask; and removing the photoresist layer. Because the thickness of the epitaxial layer 42 is less than 100 nm, the depth of the second trench 43 is less than 100 nm. Because the thickness of the epitaxial layer 42 is smaller, correspondingly, the depth of the second trench 43 is smaller. Therefore, it is advantageous to control the profile of the second trench 43 in the etching process, and to improve performance of the semiconductor device.

Figure 13:
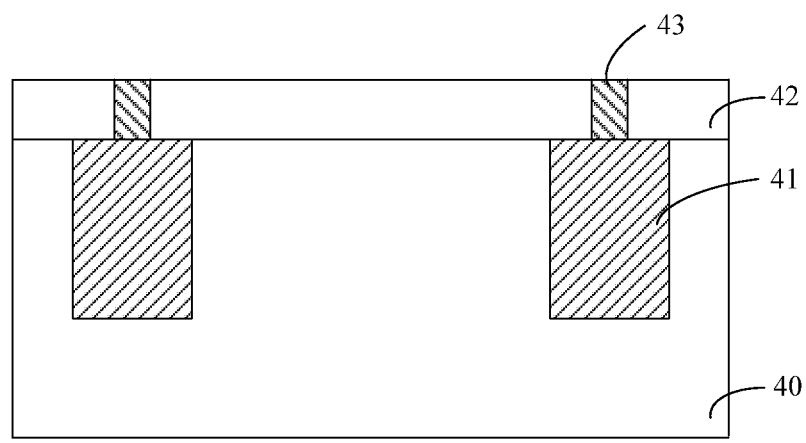

Referring to FIGS. 9 and 13, the step S44 is performed. The second dielectric layer is filled into the second trench so that the top surface of the second dielectric layer is flushed with that of the epitaxial layer. Specifically, the second dielectric layer is filled into the second trench 43, and then is planarized so that the top surface of the second dielectric layer is flushed with that of the epitaxial layer. The planarization may be performed by CMP method. The second dielectric layer may be made of silicon oxide, silicon nitride or a combination thereof. The second dielectric layer may be made of the same or different material from that of the first dielectric layer.

Figure 14:
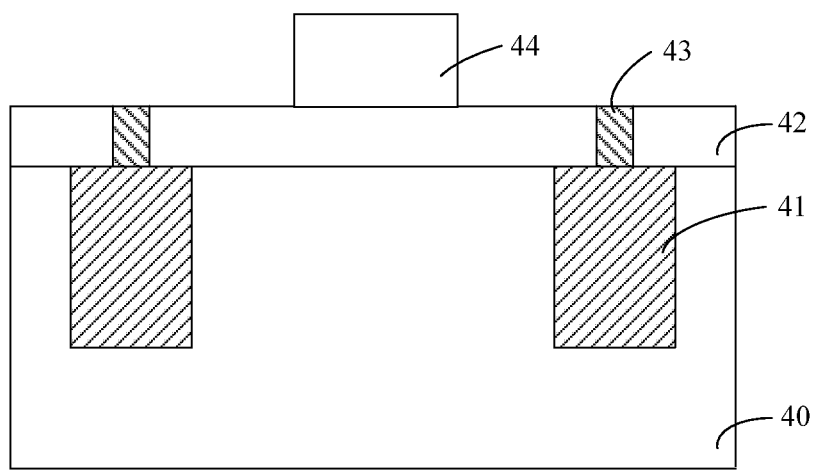

Then, referring to FIG. 14, semiconductor devices may be formed on the epitaxial layer 42 between the second trench 43. The semiconductor device may be a MOSFET comprising a gate structure 44, a source and a drain, or a bipolar transistor or other semiconductor devices in other embodiments.

Similar to the first embodiment of the present invention, dimension of the second trench 43 in the second embodiment is smaller. Correspondingly, dimension of the divot is smaller, which may improve performance of the semiconductor devices.

Although the present invention has been disclosed as above with reference to preferred embodiments, it is not intended to limit the present invention. Those skilled in the art may modify and vary the embodiments without departing from the spirit and scope of the present invention. Accordingly, the scope of the present invention shall be defined in the appended claims.

What is claimed is:

1. A shallow trench isolation (STI) structure, comprising:
a first semiconductor substrate;
a first trench formed on a bottom surface of the first semiconductor substrate and filled up with a first dielectric layer, wherein the first dielectric layer covers the bottom surface of the first semiconductor substrate;
a second trench formed on a top surface of the first semiconductor substrate and interconnected with the first trench, wherein the second trench is filled up with a second dielectric layer, a top surface of the second dielectric layer is flushed with that of the first semiconductor substrate, and the second trench has a width smaller than that of the first trench; and
a second semiconductor substrate and a third dielectric layer formed on a top surface of the second semiconductor substrate, wherein the third dielectric layer is bonded with the first dielectric layer which covers the bottom surface of the first semiconductor substrate.

2. The STI structure of claim 1, wherein either of the first semiconductor substrate or the second semiconductor substrate is a silicon substrate, a silicon germanium substrate, a III-V group compound substrate, a silicon carbide substrate or a stacked structure thereof, or a silicon on insulator substrate, or a diamond substrate.

3. The STI structure of claim 1, wherein the first semiconductor substrate comprises an epitaxial layer thereon, the first trench being formed in the first semiconductor substrate, and the second trench being formed in the epitaxial layer.

4. The STI structure of claim 3, wherein the epitaxial layer has a thickness less than 100 nm.

* * * * *